United States Patent
Guyot et al.

(10) Patent No.: US 12,431,643 B2
(45) Date of Patent: Sep. 30, 2025

(54) STIFFENER DEVICE FOR AN M.2 TYPE CONNECTOR

(71) Applicant: SAFRAN ELECTRONICS & DEFENSE, Paris (FR)

(72) Inventors: Pascal Guyot, Moissy-Cramayel (FR); Martial Chantre, Moissy-Cramayel (FR); Vincent Michel André Prevost, Moissy-Cramayel (FR); Denis Jean André Lecordier, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 420 days.

(21) Appl. No.: 17/817,414

(22) Filed: Aug. 4, 2022

(65) Prior Publication Data

US 2023/0041681 A1  Feb. 9, 2023

(30) Foreign Application Priority Data

Aug. 4, 2021  (FR) ...................................... 2108458

(51) Int. Cl.
   *H01R 12/73*  (2011.01)
   *H01R 12/70*  (2011.01)
   *H05K 1/18*  (2006.01)
(52) U.S. Cl.
   CPC ......... *H01R 12/7011* (2013.01); *H01R 12/73* (2013.01); *H05K 1/18* (2013.01); *H05K 2201/10189* (2013.01); *H05K 2201/10393* (2013.01); *H05K 2201/10409* (2013.01); *H05K 2201/2018* (2013.01)

(58) Field of Classification Search
   CPC ...... H01R 12/7011; H01R 12/73; H05K 1/18; H05K 2201/10189; H05K 2201/10393; H05K 2201/10409; H05K 2201/2018; H05K 2201/042; H05K 2201/2009; H05K 2201/2036; H05K 2201/2045; H05K 7/1461; H05K 1/141; H05K 3/368; G06F 1/185
   See application file for complete search history.

(56) References Cited

U.S. PATENT DOCUMENTS

| 5,871,362 | A  * | 2/1999  | Campbell ............. H01R 12/52 439/74 |
| 10,103,466 | B1 * | 10/2018 | Sporer ................... G06F 1/185 |
| 2004/0070944 | A1 |  4/2004 | Wells et al. |
| 2006/0221588 | A1 | 10/2006 | Summers et al. |

(Continued)

OTHER PUBLICATIONS

France Search Report and Written Opinion mailed Apr. 7, 2022, issued in Application No. FR2108458, filed Aug. 4, 2021, 8 pages.

*Primary Examiner* — Abdullah A Riyami
*Assistant Examiner* — Nelson R. Burgos-Guntin
(74) *Attorney, Agent, or Firm* — CHRISTENSEN O'CONNOR JOHNSON KINDNESS PLLC

(57) ABSTRACT

A stiffener device is suitable for use with an assembly that includes an electronic mother board, an electronic daughter board, a connector for connecting the daughter board parallel to the mother board, and an element for holding in position the daughter board in relation to the mother board. The stiffener device has a main clamp configured to hold tightly the upper surface and the lateral vertical surfaces of the connector.

10 Claims, 2 Drawing Sheets

(56) References Cited

U.S. PATENT DOCUMENTS

| | | | |
|---|---|---|---|
| 2007/0161275 A1* | 7/2007 | McBroom | G06F 1/185 |
| | | | 439/160 |
| 2014/0273551 A1* | 9/2014 | Resendez | H01R 12/737 |
| | | | 439/65 |
| 2020/0389975 A1* | 12/2020 | Lai | G06F 1/185 |
| 2024/0057275 A1* | 2/2024 | Yang | H05K 5/0043 |
| 2024/0147650 A1* | 5/2024 | Annis | H05K 7/1461 |

* cited by examiner

STIFFENER DEVICE FOR AN M.2 TYPE CONNECTOR

CROSS-REFERENCE TO RELATED APPLICATION

This application claims priority to FR 2108458, filed Aug. 4, 2021, the disclosure of which is hereby expressly incorporated by reference herein in its entirety.

TECHNICAL FIELD

The present disclosure relates to electronic connectors disposed in a severe vibratory environment, and more particularly M.2, or NGFF, type right angle connectors, making it possible to connect a daughter board to a mother board so as to keep the two boards parallel.

In particular, it relates to a stiffening device for the mounting of a daughter board on a mother board by means of such a connector.

BACKGROUND

In an electronic system, an electronic mother board is a printed circuit the function of which is to connect together the various components and peripherals of the electronic system. Among these various components, it is possible to find other electronic modules referred to as daughter boards. These electronic daughter boards may be 3G, 4G, 5G, Wi-Fi radio modules or any other module used to exchange data between the electronic system and the exterior of the circuit, or more broadly any other circuit.

As electronic systems must most of the time meet space constraints, it has been necessary, in order particularly to save space, to connect the electronic daughter board parallel to the mother board. This type of connection is particularly possible with the M.2, or NGFF, type connectors that fasten on the mother board and offer a port making it possible to insert the daughter board, thus electronically linking the two printed circuits, the daughter board being held in place parallel to the mother board with the aid of a holding element such as a screw.

This connection method is known and standard, and has been designed for receiving environments, undergoing only few vibrations. No particular precaution is therefore provided to guarantee the strength of the connection.

On the contrary, the vibratory environments that are encountered within an aircraft may frequently cause damages to such connectors, for example the deformation of the mother board or the premature wear of the contacts, of the connector, or also the removal of the daughter board from its slot.

It has been possible to develop solutions consisting in making the environment not severe, but they have proven to be expensive, heavy and voluminous, and therefore incompatible with the vibratory environment that reigns on board in an aircraft.

In addition, certain daughter boards, for example radio modules, consume a lot of energy and therefore heat up fairly significantly. The calories may then only be removed, in the basic connector, by radiation, which is not very effective, by convection, which proves to be restrictive because requiring for example the installation of a fan, or by conduction.

In the basic connector technology of the M.2 connector, few contacts are provided and the removal of calories is therefore difficult, only being able to be performed by the position holding screw and by the area of contact between the connector and the boards.

As some environments are subjected to high temperatures, damage may therefore be caused to such connectors.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In view of the aforementioned, the objective of the present disclosure is therefore to propose an inexpensive, lightweight and compact solution making it possible to stiffen the parallel mounting of a daughter board on a mother board by an M.2 type connector, while making it possible to effectively remove the heat generated by the electronic system.

Therefore, the object of the disclosure is a stiffener device for an assembly comprising an electronic mother board, an electronic daughter board, a connector for connecting the daughter board parallel to the mother board, and an element for holding in position the daughter board in relation to the mother board, the stiffener device comprising a main clamp intended to hold tightly the upper surface and the lateral vertical surfaces of the connector.

Thus, the main clamp stiffens the system around the connector, while making it possible to manipulate, connect and disconnect the daughter board.

Advantageously, the main clamp comprises a first lateral vertical wall, an upper wall and a second lateral vertical wall giving the main clamp an inverted U-shape.

Thus, the clamp surrounds and holds tightly the connector laterally and on its upper surface, without obstructing the manipulation, the connection and the disconnection of the daughter board. The clamp stiffens the structure, thus making it possible to limit vibrations.

Preferably, the main clamp comprises an outer vertical wall connected to the first and second lateral vertical walls and to the upper wall by their outer end.

The stiffness is then increased.

Advantageously, the device comprises elements for attaching the device to the mother board, these elements for attaching being respectively positioned on two shoulders perpendicularly connected respectively to the first and second lateral vertical walls at their end opposite the upper wall.

Preferentially, an upper peripheral frame is positioned in the plane of the shoulders, on the side of the main clamp opposite its outer vertical wall, the upper peripheral frame being intended to support the daughter board.

Thus, the resonance frequencies of the structure are increased, which significantly reduces the deformation amplitude on contact with the vibrations of the environment. The parts of the structure therefore deform less and therefore no longer move in relation to one another.

Advantageously, the upper peripheral frame comprises a recess.

Thus, the device gains in lightness.

Advantageously, a thermal interface is housed in the recess.

The thermal interface is flexible and therefore maximizes the contact surface with the daughter board, in comparison with a solid and stiff peripheral frame. In addition, the thermal interface removes the calories, in order to lower the temperature of the daughter board. The thermal amplitude encountered by the daughter board is therefore reduced, and the thermomechanical stress due to the differences in expansion coefficients between the various components fastened together is reduced. The solder joints particularly are thus protected.

Preferably, the device comprises fastening elements configured to fasten the upper peripheral frame to the mother board, and the upper peripheral frame is intended to be connected to the daughter board by the element for holding in position.

Advantageously, a stringer parallel to the upper wall of the main clamp, below the main clamp, and intended to be placed under the lower surface of the mother board.

Preferably, the elements for attaching connect the stringer to the shoulders.

Advantageously, the device comprises a lower peripheral frame positioned in the plane of the stringer, on the side of the main clamp opposite its outer vertical wall, and intended to be placed under the lower surface of the mother board, parallel to the mother and daughter boards, and intended to be connected to the mother board by securing elements.

Preferably, the securing elements and the fastening elements are the same.

DESCRIPTION OF THE DRAWINGS

The foregoing aspects and many of the attendant advantages of this disclosed subject matter will become more readily appreciated as the same become better understood by reference to the following detailed description, when taken in conjunction with the accompanying drawings, wherein.

DETAILED DESCRIPTION

While illustrative embodiments have been illustrated and described, it will be appreciated that various changes can be made therein without departing from the spirit and scope of the disclosure.

Figure 1:
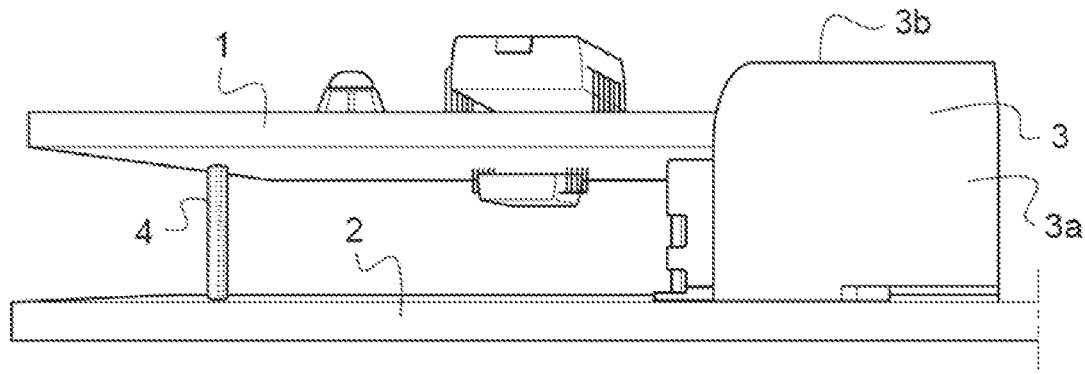
FIG. 1 illustrates in a general manner the connection of a daughter board to a mother board by means of a conventional M.2 type connector.

Reference will first be made to FIG. 1, which schematically illustrates the connection of an electronic daughter board 1 to an electronic mother board 2 by means of a connector 3 according to the prior art.

The connector 3 here is an M.2, or NGFF, type connector, or any other connector intended to position the daughter board 1 parallel to the mother board 2.

As illustrated, the daughter board 1 and the mother board 2 are assembled and connected together by means of a connector 3, the daughter board being held parallel to the mother board 2 for example by means of a screw 4.

As indicated above, this type of assembly of a daughter board and of a mother board is not suitable for connecting a module to a main electronic board in an intense vibratory environment.

Figure 2:
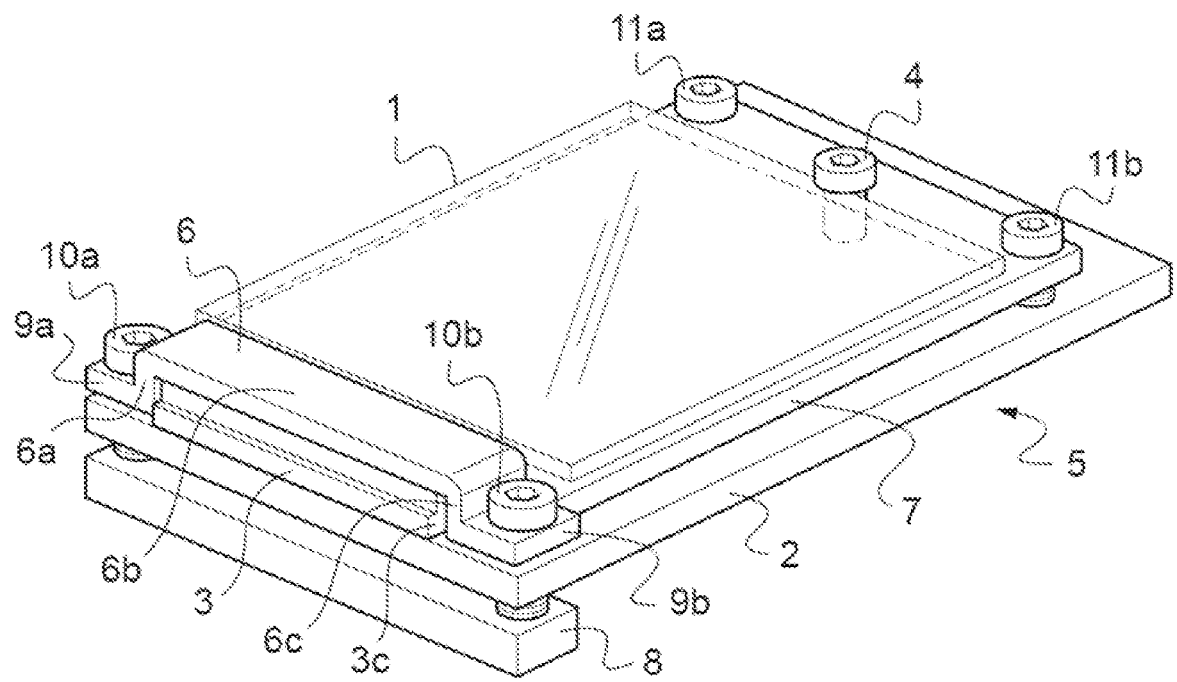
FIG. 2 schematically illustrates the structure of a stiffener device according to the disclosure.

FIG. 2 shows an example of embodiment of an assembly system intended to connect an electronic module 1, in this instance a daughter board, and a mother board 2, in a vibratory environment.

The assembly system includes a connector 3 plugged into the mother board 2, wherein is inserted the daughter board 1, and a stiffener device 5 surrounding the connector 3.

The stiffener device 5 comprises a main clamp 6, an upper peripheral frame 7, and a stringer 8.

The main clamp 6 comprises a first vertical lateral wall 6a, an upper wall 6b and a second lateral vertical wall 6c opposite the wall 6a. The walls 6a and 6c are respectively extended in their end opposite the upper wall 6b by two perpendicular shoulders 9a and 9b. These shoulders 9a and 9b are the support for elements for attaching, comprising two screws 10a and 10b. The screws 10a and 10b connect the main clamp 6 to the mother board 2 on either side laterally of the connector 3. The main clamp 6 is designed so as to hold tightly the lateral vertical surfaces 3a and 3c and the upper surface 3b of the connector 3. The main clamp 6 thus stiffens the system around the connector 3, while making it possible to manipulate, connect and disconnect the daughter board 1, the clamp 6 not holding tightly a front surface of the connector 3. The main clamp 6 is preferably produced with the aid of a chain of dimensions in order to ensure that the walls of the clamp will not come into contact with the lugs of the connector 3, with its joint, or with its assembly range. Thus, the risk of short-circuit is avoided in the event where the clamp is conductive, and in any case, a risk of premature deterioration and of mechanical fatigue is avoided.

The upper peripheral frame 7 is positioned in the horizontal plane of the shoulders 9a and 9b. The upper peripheral frame 7 is therefore positioned above the mother board 2. It comprises fastening elements to fasten to the mother board 2, consisting of in FIG. 2 the screws 11a and 11b. The upper frame 7 forms with the main clamp 6 one and same part. The upper peripheral frame 7 is placed under the daughter board 1. The screw 4 secures the upper peripheral frame 7 and the daughter board 1. The daughter board 1 is supported by the upper peripheral frame 7. In this manner, the resonance frequencies of the structure are increased, which significantly reduces the deformation amplitude on contact with the vibrations of the environment. The parts of the structure therefore deform less and no longer move in relation to one another.

The upper frame 7 is flat, and may be solid. It may also, as on the embodiment of FIG. 2, contain a recess. This recess reduces the weight of the device 5 and may make it possible to house a thermal interface, not shown in FIG. 2. The flexibility of the thermal interface itself makes it possible to match the shapes of the daughter board 1, thus maximizing the contact surface and thereby the removal of the heat generated by the operation of the daughter board 1. The thermal amplitude encountered by the daughter board 1 is therefore reduced, and the thermomechanical stress due to the differences in expansion coefficients between the various components fastened together is reduced. The solder joints particularly are thus protected.

The stringer 8 is positioned under the mother board 2, parallel to the wall 6b and to the connector 3.

The screws 10a and 10b hold in position and secure together the main clamp 6, the mother board 2 and the stringer 8. The main clamp thus holds tightly the connector 3, significantly limits the deformations at the connector 3, and does not obstruct the manipulation, the connection and the disconnection of the daughter board 1 in the connector 3. The stringer 8 makes it possible to gain in stiffness in relation to one embodiment comprising the main clamp 6 alone.

Figure 3:
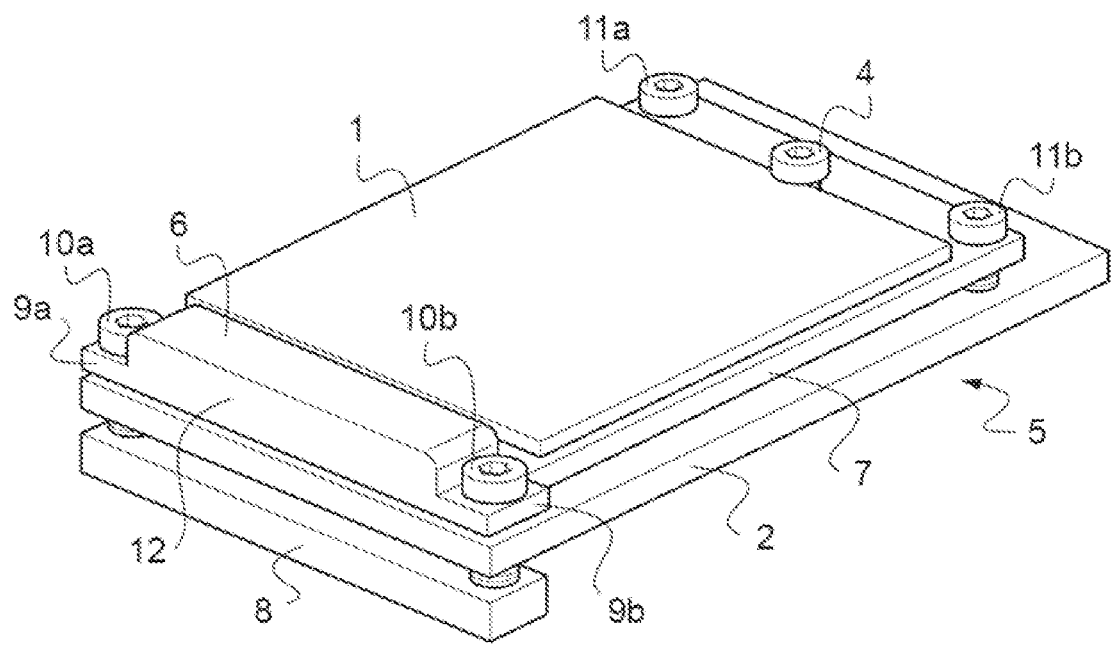
FIG. 3 illustrates another embodiment of a stiffener device according to the disclosure.

FIG. 3 shows a variant of the device 5 according to the disclosure. In this figure, wherein the daughter board has been shown in an opaque manner, elements identical to those of FIG. 2 bear the same numerical references. The main clamp 6 comprises, as opposed to the preceding embodiment, an outer lateral wall 12 holding tightly the rear of the connector 3. This wall 12 constitutes a back for the main clamp 6 and makes it possible to improve the second moment of area in the rear direction. Thus, the stiffness of the structure is improved.

It is also possible in order to gain in stiffness to add a lower peripheral frame similar to the upper frame 7 under the mother board 2, in the plane of the stringer 8. This lower peripheral frame may constitute a single part with the stringer 8, and is parallel to the upper peripheral frame 7, when the embodiment comprises both frames. It is fastened to the mother board 2 by securing elements that may be the screws 11a and 11b, in order to gain in lightness.

The stringer 8, the outer wall 12, the upper 7 and lower peripheral frames, the recess and the slot of a thermal interface are as many options to be combined with the main clamp 6 to improve the effectiveness of stiffening and of removal of the heat of the device 5 according to the disclosure.

The elements of the device 5 may be produced by machining, molding, additive manufacturing, and may be made of metal, of plastic, of composite material, etc.

The assembly of the device 5 and of the structure is carried out by a first step during which the connector 3 is assembled to the mother board 2, for example by soldering. Subsequently, the device 5 is fastened to the connector 3 and the mother board 2 by fastening the screws 10a, 10b, 11a, and 11b. It is then possible to insert a thermal interface into the recess of the upper peripheral frame 7. The daughter board 1 may then be inserted into the connector 3, then fastened to the frame 7 and to the mother board 2 by installing the screw 4.

The embodiments of the disclosure in which an exclusive property or privilege is claimed are defined as follows:

1. A stiffener device for an assembly comprising an electronic mother board, an electronic daughter board, a connector configured to connect the daughter board parallel to the mother board, and an element for holding in position the daughter board in relation to the mother board, the stiffener device comprising a main clamp configured to hold tightly an upper surface and lateral vertical surfaces of the connector, wherein the main clamp comprises a first lateral vertical wall, an upper wall and a second lateral vertical wall giving the main clamp an inverted U-shape, and the clamp is configured to surround and hold tightly the connector laterally and on the upper surface.

2. The stiffener device according to claim 1, wherein the main clamp comprises an outer vertical wall connected to the first and second lateral vertical walls and to the upper wall by their outer end.

3. The stiffener device according to claim 1, further comprising elements for configured to attach the device to the mother board, the elements being respectively positioned on two shoulders perpendicularly connected respectively to the first and second lateral vertical walls by their end opposite the upper wall.

4. The stiffener device according to claim 3, further comprising an upper peripheral frame positioned in a plane of the shoulders, on the side of the main clamp opposite its outer vertical wall, the upper peripheral frame being configured to support the daughter board.

5. The stiffener device according to claim 4, wherein the upper peripheral frame comprises a recess.

6. The stiffener device according to claim 5, wherein a thermal interface is housed in the recess.

7. The stiffener device according to claim 4, further comprising attachment elements configured to fasten the upper peripheral frame to the mother board, wherein the upper peripheral frame is configured to be connected to the daughter board by the element for holding in position.

8. The stiffener device according to claim 1, further comprising a stringer parallel to the upper wall of the main clamp, below the main clamp, and configured to be placed under the lower surface of the mother board.

9. The stiffener device according to claim 8, wherein the attachment elements connect the stringer to the shoulders.

10. The stiffener device according to claim 8, further comprising a lower peripheral frame positioned in the plane of the stringer, on the side of the main clamp opposite its outer vertical wall and configured to be placed under the lower surface of the mother board, parallel to the mother and daughter boards, and configured to be connected to the mother board by attachment elements.

* * * * *